(12) United States Patent
Mitchell (10) Patent No.: US 6,566,661 B1
(45) Date of Patent: May 20, 2003

(54) ION IMPLANTER WITH WAFER ANGLE AND FARADAY ALIGNMENT CHECKING

(75) Inventor: Robert John Clifford Mitchell, Pulborough (GB)

(73) Assignee: Applied Materials, Inc., Santa Clara, CA (US)

( * ) Notice: Subject to any disclaimer, the term of this patent is extended or adjusted under 35 U.S.C. 154(b) by 65 days.

(21) Appl. No.: 09/685,773

(22) Filed: Oct. 11, 2000

(30) Foreign Application Priority Data

Oct. 12, 1999 (GB) ............................................. 9924176

(51) Int. Cl.$^7$ ................................................ H01J 37/00
(52) U.S. Cl. ............... 250/489; 250/491.1; 250/492.21; 250/397
(58) Field of Search ..................... 250/491.1, 492.21, 250/397

(56) References Cited

U.S. PATENT DOCUMENTS 4,744,713 A * 5/1988 Hrovath ...................... 414/222
5,422,490 A * 6/1995 Nakamura et al. ...... 250/492.21
6,207,959 B1 * 3/2001 Satoh et al. ............. 250/442.11

FOREIGN PATENT DOCUMENTS

| WO | WO9802900 | 1/1998 |
|----|-----------|--------|
| WO | WO9913488 | 3/1999 |

* cited by examiner

*Primary Examiner*—Bruce Anderson
*Assistant Examiner*—Zia R. Hashmi
(74) *Attorney, Agent, or Firm*—Boult Wade Tennant (57) ABSTRACT

A beam/wafer alignment arrangement has a laser and sensor mounted on the scanning magnet. Direct alignment of the wafer relative to the scanning magnet is determined by reflecting the beam in a specular surface on the wafer holder back to the sensor. Correct alignment of the wafer translation direction is also confirmed from any movement of the reflected light spot on the sensor as the wafer holder is translated up and down. A further sensor is mounted on the beam stop to monitor any misalignment of the process chamber to the collimator magnet, and for checking the location of the travelling Faraday.

27 Claims, 6 Drawing Sheets

ION IMPLANTER WITH WAFER ANGLE AND FARADAY ALIGNMENT CHECKING

FIELD OF THE INVENTION

The invention is concerned with ion implanters and particularly with an arrangement for checking the angle of the wafer on a holder to be implanted and the alignment of a travelling Faraday in the implant chamber, used for setting up the ion beam prior to implantation.

BACKGROUND OF THE INVENTION

Ion implanters have been used for many years in the processing of semiconductor wafers. Typically a beam of ions of a required species is produced and directed at a wafer or other semiconductor substrate, so that ions become implanted under the surface of the wafer. Implantation is typically used for producing regions in the semiconductor wafer of altered conductivity state, by implanting in the wafer ions of required dopant.

Known ion implanters include batch type implanters and single wafer type implanters. In single wafer type implanters, the ion beam is usually scanned transversely in one orthogonal direction at a relatively high scanning rate, and the single wafer being implanted is mechanically translated to and fro across the scanned beam substantially in a second orthogonal direction. The ion beam can be scanned electrostatically or electromagnetically and it is normal practice to collimate the scanned beam so that the beam impinging on the wafer remains parallel to a desired beam direction during scanning.

The angle at which the ion beam strikes the wafer during an implantation process is important. Many implants are conducted with the ion beam precisely normal to the wafer surface, i.e. where the ion beam has zero angle relative to a normal to the wafer surface. In other processes, implants may be conducted with the normal to the wafer surface at a predetermined angle to the ion beam, for example if it is desired to minimise channelling effects as ions penetrate into the crystal structure of the wafer, or else if it is desired to implant into the walls of trenches or other physical structures on the wafer surface prepared by previous processes, or avoid shadowing by such structures.

It is often important to control the angle of implantation closely, especially for ensuring zero implant angle in certain processes.

It is known in single wafer type implanters for the wafer holder to be adjustable about an axis parallel to the plane of the wafer on the holder, for the purpose of adjusting the implant angle. For example, WO 99/13488 discloses an implant chamber for a single wafer type ion implanter in which the wafer is mounted on a holder and the holder can be translated to and fro through the plane of a scanned ion beam entering the implant chamber. The scanning mechanism can itself be rotated about an axis substantially through the plane of the wafer, so as not only to adjust the angle of the wafer relative to the ion beam, but also to change the direction of the mechanical reciprocating translation of the wafer, so that the wafer holder is always reciprocated in the plane of the wafer.

The above referred International patent application also discloses the provision of a travelling Faraday which can be moved to different positions in the direction of scanning of the beam, for the purpose of checking the rate of dose delivery at different points over the range of scanning of the beam. The travelling Faraday in the above International patent application is also used, in association with a further travelling Faraday upstream in the beam direction, for confirming beam parallelism and scan uniformity.

SUMMARY OF THE INVENTION

An object of the present invention is to provide an arrangement in an implanter for accurately confirming the angle relative to the beam of a wafer on the wafer holder, so as to ensure an implant is performed at the correct implant angle. A further object of the present invention is the provision of an arrangement to confirm the alignment of a travelling Faraday used in an implant chamber, so that measurements by the travelling Faraday can be correctly referred to a datum alignment in the implant chamber.

Accordingly, in one aspect, the invention provides an ion implanter having an evacuatable implant chamber, a holder inside the chamber for holding a semiconductor wafer at a selected wafer angle during implantation, said holder being adjustable about at least one axis parallel to the plane of a wafer on the holder for changing said wafer angle, a source of focused electromagnetic radiation mounted relative to said implant chamber and arranged to direct said radiation for reflection at a surface of a wafer held on said holder or at a surface of the holder which is parallel or at a known angle to the plane of a wafer when held on said holder, and a sensor mounted relative to said implant chamber to receive radiation from said source reflected specularly by the wafer surface or by said holder surface, said sensor providing a signal, in response to the reflected radiation, which is indicative of a predetermined wafer angle. The arrangement disclosed above enables the angle of the wafer to be set to the predetermined angle by monitoring the signal from the sensor.

Preferably, said source of electromagnetic radiation and said sensor are mounted outside the implant chamber and the chamber has at least one window transparent to said radiation through which the focused radiation from said radiation source is directed into the chamber, and the reflected radiation leaves the chamber for reception by said sensor. Then, the presence of additional sensing equipment within the implant chamber is avoided, which is important to minimise contamination during implant processes, and also for serviceability of the angle sensing equipment.

In preferred embodiments, the radiation source is arranged to produce an illuminated spot of said reflected radiation on said sensor. Typically the source is a laser arranged to provide a substantially parallel beam of said radiation.

The sensor may have a sensitive area providing a signal representative of the position of the illuminated spot on said area at least in a direction perpendicular to the axis of adjustability of the wafer holder. In this way, the sensor can provide an output signal having a range of values for comparison by control equipment with a desired datum value corresponding to the desired predetermined angle of the wafer.

In a preferred embodiment, the implanter includes a drive unit to adjust the rotary position of the holder about said axis, and a controller responsive to the signal from said sensor to control said drive unit to adjust said holder position to bring said illuminated spot to a desired position on the sensitive area of the sensor corresponding to the predetermined wafer angle.

Normally, the implanter has a source of ions to be implanted, and a scanner and collimator combination to produce a parallel scanned beam of said ions in said implant chamber for implantation in a wafer on said holder. Then preferably, said scanner and collimator combination define an ideal beam direction for said parallel scanned beam, and said radiation source and said sensor are mounted so as to be referenced to said ideal beam direction defined by the scanner and collimator combination, whereby said predetermined wafer angle is referenced to said ideal beam direction.

In one embodiment, said scanner and collimator combination scans the beam in a scan direction perpendicular to the beam direction in a beam scanning plane, and the implanter further includes an actuator for translating the wafer holder through the beam scanning plane in a translation plane containing said scan direction and having a translation angle to the normal to the beam scanning plane, a first rotary drive unit to adjust said translation angle and effecting a corresponding adjustment of said wafer angle, a second rotary drive unit to change the angle of the wafer holder relative to the actuator about an axis parallel to said scan direction to adjust the angle of a wafer on the holder relative to said translation angle, and a controller responsive to the signal from the said sensor to control said first rotary drive unit to adjust said translation angle and said wafer angle to bring said illuminated spot to a desired position on the sensitive area of the sensor corresponding to the predetermined wafer angle, and to control said second rotary drive to adjust the wafer angle relative to the translation angle to minimise any movement of said spot on said sensor when said actuator translates the wafer to move the point of reflection of said radiation over the surface of the wafer.

The present invention also provides an ion implanter having an evacuatable implant chamber, a source of ions to be implanted, a scanner and collimator combination to produce a parallel scanned beam of said ions in said implant chamber for implantation in a semiconductor wafer, a travelling beam detector movable in said implant chamber along a line parallel to the direction of scanning of said beam and usable for checking alignment of the scanned beam, a point source of electromagnetic radiation mounted relative to said implant chamber, and an in-line sensor mounted relative to said implant chamber responsive to the radiation from said source received along a line of transmission crossing said line of movement of the travelling beam detector, the travelling beam detector having a structure which interrupts at least partially said radiation received by the sensor, whereby said in-line sensor provides a signal indicative of at least one predetermined position of the travelling beam detector. With this arrangement, at least one datum position of the travelling beam detector (which may be a Faraday) in its line of travel in the beam scanning direction can be accurately confirmed, so that subsequent use of the travelling beam detector for checking beam alignment can be referenced to the known datum position.

Preferably, the above arrangement for checking the datum of the travelling beam detector can be used in combination with the previously described arrangement for confirming the wafer angle. Then the above referred point source of electromagnetic radiation may be constituted by the source of focused radiation which is also used for checking the wafer angle, and the implanter should then further include an actuator for translating the wafer holder transversely of the plane of the scanned beam. In this way, the wafer holder can be located to intercept the electromagnetic radiation from the source for reflecting this radiation for use in confirming the wafer angle and can also be translated so as to be clear of the radiation from the source so this can be transmitted along the above mentioned line of transmission for use in confirming the position of the travelling beam detector.

In a preferred embodiment, said scanner and collimator combination define an ideal centre line for said parallel scanned ion beam in the implant chamber and said radiation point source directs a beam of said radiation along said line of transmission and is mounted so as to be referenced to said ideal beam centre line so that said line of transmission and therefore said predetermined position of the travelling beam detector are referenced to said ideal beam centre line. Preferably, then, the implanter includes a beam stop to receive the scanned beam, said beam stop including at least one fixed beam detector providing a timing signal indicating the timing of the ion beam scanning over the fixed beam detector at the beam stop, wherein said point source of radiation provides an illuminated spot of radiation on said in-line sensor and said in-line sensor is mounted so as to be referenced to said beam stop and to the position of said fixed beam detector, said in-line sensor having a sensitive area providing a signal representing the position of said illuminated spot on said area at least in a direction parallel to said beam scanning direction, whereby the position of said fixed beam detector relative to the line of transmission can be determined.

Preferably said line of transmission is substantially perpendicular to said line of movement of the travelling beam detector. Said line of transmission may be in a plane containing said ideal centre line and perpendicular to said line of movement.

Preferably, said structure of the travelling beam stop is a flag, and said travelling beam sensor has a slit opening aligned perpendicular to said beam scanning direction for receiving beam ions as the beam is scanned over the detector, and said flag is in a plane perpendicular to the beam direction which contains said slit opening.

Preferably, said in-line sensor is also mounted outside the implant chamber and the chamber has a further window through which said radiation can leave the chamber along said line of transmission.

The invention also provides an ion implanter having an evacuatable implant chamber, a source of ions to be implanted, a scanner and collimator combination to produce a parallel scanned beam of said ions in said implant chamber for implantation in a semiconductor wafer, said scanner and collimator combination defining an ideal centre line for said parallel scanned ion beam in the implant chamber, a source of electromagnetic radiation which directs a beam of said radiation along a line of transmission, and which is mounted so as to be referenced to said ideal beam centre line so that said line of transmission is referenced to said ideal beam centre line, a beam stop to receive the scanned beam, said beam stop including at least one fixed beam detector providing a timing signal indicating the timing of the ion beam scanning over the fixed beam detector at the beam stop, and an in-line sensor mounted on said line of transmission and so as to be referenced to said beam stop and to the position of said fixed beam detector, said radiation beam source providing an illuminated spot of radiation on said in-line sensor, said in-line sensor having a sensitive area providing a signal representing the position of said illuminated spot on said area at least in a direction parallel to said beam scanning direction, whereby the position of said fixed beam detector can be determined relative to said line of transmission and thereby relative to said ideal centre line.

There follows by way of example only a description of preferred embodiments of the invention.

DESCRIPTION OF THE PREFERRED EMBODIMENTS

Figure 1:
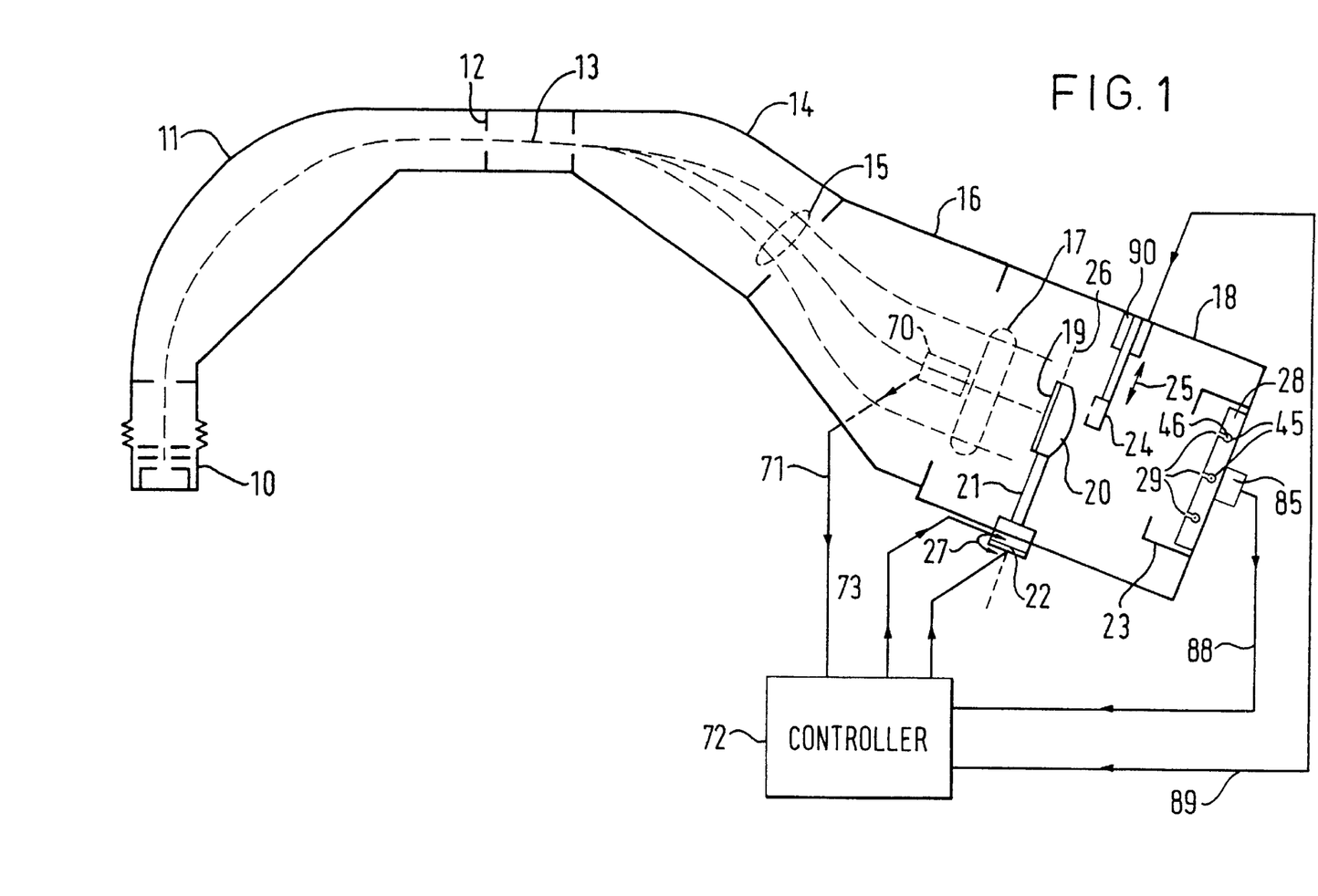
FIG. 1 is a schematic plan view of an ion implanter embodying aspects of the present invention.

Referring to FIG. 1, the beam of ions for implantation is produced by an ion source 10. The ions from the ion source pass through an analyser magnet 11 so that only ions of a desired mass/energy ratio pass through a mass selection slit 12 at the exit of the analyser magnet 11. A beam 13 of ions of the desired mass/energy then enter a beam scanner 14 in which the beam is deflected to and fro in the plane of the paper of FIG. 1, in a direction transverse to the beam path. The beam may be scanned by the scanner 14 at a relatively high repetition rate, typically between 100 and 200 Hz.

The scanned beam 15 emerging from the scanner 14 then enters a collimator 16. The collimator is arranged to bend the scanned beam 15 by differing amounts depending on the scan position of the beam, so that the scanned beam 17 emerging from the collimator 16 remains substantially parallel to a desired beam path as the beam is scanned to and fro.

The parallel scanned beam 17 emerging from the collimator 16 enters a process chamber 18 in which the beam may impinge upon a wafer 19 mounted on a wafer holder 20. The scanner 14 and collimator 16 are designed so that the scanned beam 17 extends right across the width of the wafer 19 on the holder 20, effectively drawing a stripe across the wafer as the beam is scanned to and fro.

The wafer holder 20 is itself mounted on a reciprocating scanning arm 21 carried by an actuator 22 which causes the wafer holder 20 and the wafer 19 thereon to execute a reciprocating motion through the plane of the scanned beam 17, so that all parts of the wafer can be implanted with the ions of the beam. Normally, the reciprocating scanning motion of the wafer holder 20 is at a relatively lower repetition rate, typically of the order of 1 Hz.

The elements of the ion implanter described so far may be as constituted in known ion implanters, particularly, implanters for implanting single wafers one at a time and employing a hybrid scanning system in which the ion beam is scanned transversely in one direction, whilst the wafer is mechanically reciprocated in an orthogonal direction. As mentioned previously, an ion implanter of this kind is described in WO 99/13488. The ion source, mass analysis and scanning and collimating arrangements of the example of the present invention illustrated in FIG. 1 may be of kinds known to those skilled in the art. For example, the scanner 14 may use either electromagnetic or electrostatic scanning and similarly the collimator 16 may employ magnetic or electrostatic fields.

Although the above mentioned prior art specification discloses a particular mechanical system for providing the reciprocation motion of the wafer holder 20 in the process chamber 18, any suitable mechanical arrangement may alternatively be employed. However, it is important as will become apparent, that the mechanical scanning system enables the wafer holder 20 to be adjusted about a rotary axis, such as axis 26, parallel to the plane of the wafer 19 on the holder 20. This rotary adjustability of the wafer angle about the axis 26 is represented in FIG. 1 by the arrows 27. The axis 26 is not only parallel to the wafer 19, but also parallel to the plane of scanning of the ion beam, i.e. parallel to the plane of paper in FIG. 1.

In the process chamber 18, a beam stop 23 is located behind the wafer 20 to receive the scanned beam when the water holder 20 is positioned so as not to intercept the beam. In addition, a travelling Faraday 24 is provided located just behind the wafer holder 20. The travelling Faraday is designed to provide a current pulse in response to the ion beam scanning over the Faraday. The Faraday 24 may be employed for obtaining measurements of the ion dose rate provided by the ion beam at various points over the scan of the ion beam. For this purpose the travelling Faraday 24 can be moved transversely of the direction of the ion beam, in the direction of the arrow 25, to different positions over the range of scan of the scanned beam.

During implantation of a wafer 19 on the holder 20, the Faraday 24 may be located near one end of the range of scan of the ion beam, just clear of an edge of the wafer holder 20, so as to provide signals indicating the rate of dose delivery of the ion beam during implantation.

Insofar as its applications have been described above, the scanning Faraday 24 provides the same function as the Faraday disclosed in the ion implanter described in the above mentioned prior art specification WO 99/13488.

Figure 2:
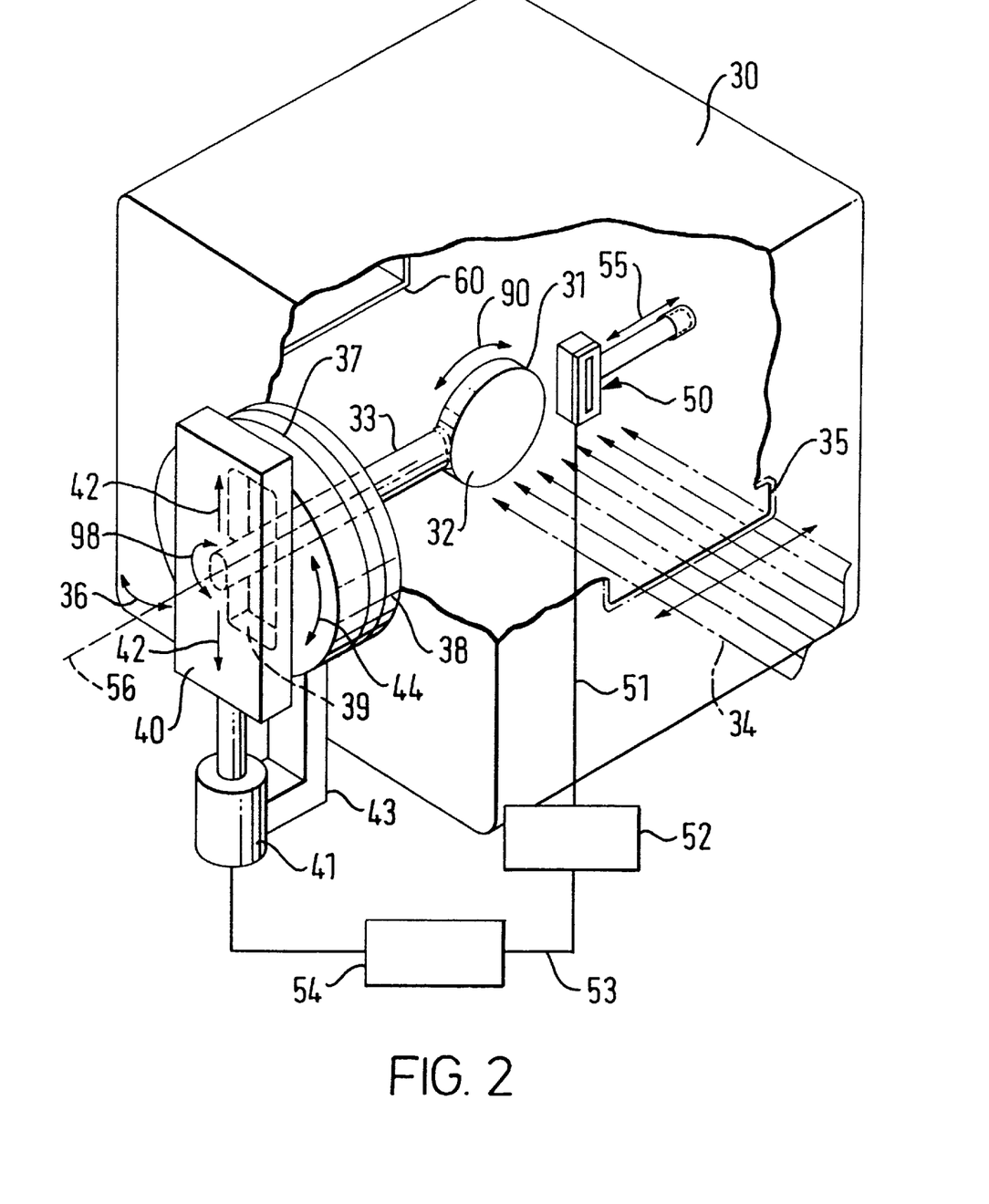
FIG. 2 is a schematic view of an implant chamber suitable for use in embodiments of the present invention.

Referring now to FIG. 2, this illustrates in more detail the mechanical arrangement for reciprocating the wafer holder in the implant chamber. The implant chamber 30 is illustrated with a corner broken away to reveal the wafer holder 31 carrying a wafer 32 and mounted on the inner end of a scanning arm 33. The scanned ion beam 34 enters the implant chamber 30 through an opening 35. It will be understood that the opening 35 would, in the complete ion implanter, communicate with another evacuated chamber upstream of the implant chamber 30, for example the collimator 16 as illustrated in FIG. 1.

The scanning arm 13 is mounted in the chamber 30 by means of a scanning arrangement illustrated generally at 36. The scanning arrangement comprises a rotary disc 37 which is mounted by means of a rotary vacuum seal 38 on a side wall of the implant chamber 30, in order to close a circular aperture through the side wall which is not directly visible in FIG. 2.

The rotary disc 37 has an elongate aperture, illustrated in dotted outline at 39 which is itself covered by a slide plate 40. The slide plate 40 carries the scan arm 33 extending through the elongate aperture 39 in the rotary disc 37. A linear vacuum seal is provided between the slide plate 40 and the rotary disc 37 to close off the interior of the implant chamber 30.

The reciprocating motion of the wafer holder 31 through the scanned beam 34 is provided by an actuator 41 which drives the slide plate 40 to and fro in the direction of arrows 42, with this motion of the scan arm 33 being accommodated by the elongate opening 39 through the rotary disc 37. The actuator 41 is itself mounted on the rotary disc 37 by a mount 43.

In operation of the scanning mechanism as illustrated in FIG. 2, the angle at which the wafer 32 on the holder 31 is presented to the ion beam 34 can be adjusted by adjusting the rotary position of the disc 37 in the direction of the arrow 44. As well as adjusting the angle between the wafer and the ion beam, this rotary adjustment of the disc 37 also adjusts the direction of the reciprocating movement applied to the scan arm 33 by the slide plate 40, so that the reciprocating motion is always in the plane of the wafer 32 held on the holder 31.

A travelling Faraday 50 is also illustrated in FIG. 2 shown here located to one side of the wafer holder 31, but within the scan range of the scanned beam 34. The scanned beam sweeps over the travelling Faraday 50 on each scan of the beam during implantation of a wafer 32 on the holder 31, so that the electric charge received by the scanning Faraday 50 during each pass of the beam 34 provides an indication of the rate of delivery of dopant ions to the wafer on each scan of the beam. The current signal from the scanning Faraday 50 is supplied on a line 51 to an integrator 52 which provides a signal representing the amount of charge delivered to the Faraday on each beam scan on a line 53 for supply to a scan controller 54. The scanning controller 54 is used to control the speed of mechanical scanning of the wafer holder 31 through the ion beam in response to the measured dose rate from the Faraday 50, so as to provide an even delivery of the required dose of dopant ions over the whole surface of the wafer 32 being implanted.

The scanning mechanism 36 and the use of the Faraday 50 for dose related scanning control during implant, is described in more detail in the above referred International patent application.

The travelling Faraday 50 is also used for checking the uniformity of the beam current over the range of scanning of the scanned beam 34. For this purpose, the Faraday 50 can be moved in a direction 55 perpendicular to the beam direction and parallel to the plane of the scanned beam so as to intercept the scanned beam at selected positions across the scan. With the arrangement illustrated in FIG. 2, in order to move the scanning Faraday 50 across the scanned beam, it is necessary first to move the wafer holder 31 out of the way by operating the actuator 41 to shift the scan arm 33 to its uppermost or lowermost position. However, it may be understood that the scanning Faraday 50 may in fact be located in a slightly different plane to the plane of the wafer holder 31, for example slightly behind the wafer holder 31 as illustrated in FIG. 1. Then the travelling Faraday 50 may be moved over the scanned beam without interfering with the wafer holder 31.

The use of the scanning Faraday 50 for monitoring the uniformity of beam current over the range of scan of the beam is also described in more detail in the above referred International patent application.

It should be appreciated, however, that for monitoring the beam uniformity it is necessary to know the position of the scanning Faraday 50.

More significantly, the scanning Faraday 50 may also be used for checking the alignment of the scanned beam and in particular the parallelism of the scanned beam, i.e. that the beam remains accurately parallel to the intended beam direction over its full range of scan. For this application, accurate knowledge of the travelling Faraday position is required.

In the above referred International patent application, the traveling Faraday 50 is used together with an additional traveling Faraday further upstream along the beam for the purpose of monitoring beam alignment and beam parallelism. However, our co-pending U.S. patent application Ser. No. 09/686,803, discloses another arrangement for checking beam alignment and parallelism using a single traveling Faraday in combination with a specially designed beam stop.

Referring again to FIG. 1, the beam stop 23, which is also partly visible in FIG. 2 at 60, has an opening which is sufficient to accommodate the entire scanned beam 34. The beam stop 23 includes a water cooled beam stop plate 28 which receives the scanned beam. The front face of the beam stop plate 28 is provided with three slits 29 extending transversely of the plane of scanning of the beam, and communicating with bores 45 in the plate 28 which are aligned with the slits 29. Each of the bores 45 contains a respective current collecting rod 46 which is itself insulated from the beam stop plate 28. The current signals on these collecting rods 46 within the beam stop plate 28 can be used as timing signals indicating when the beam is scanned over the respective slit 29. By using these timing signals, in combination with the timing of current signals from the travelling Faraday 50 in corresponding positions across the scanned beam, the beam alignment and beam parallelism can be checked and confirmed.

For further details of this technique, reference should be made to the above mentioned co-pending patent application.

As mentioned above, it is important during the implanting of semiconductor wafers to arrange for the angle of implant, that is the angle between the wafer normal and the ion beam, to be accurately controlled.

Figure 3:
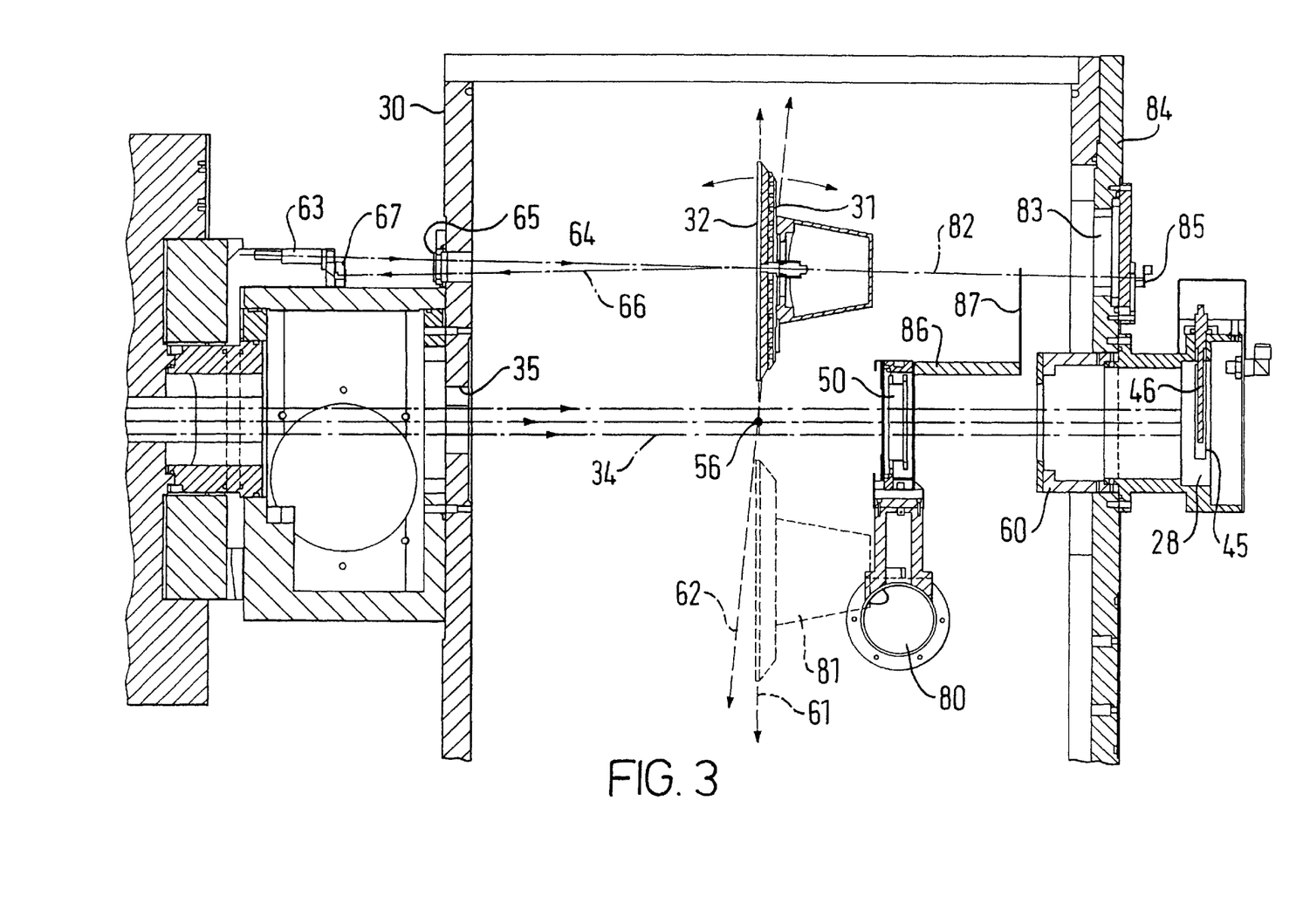
FIG. 3 is a cross-sectional view in elevation of an implant chamber embodying the present invention.
Figure 4:
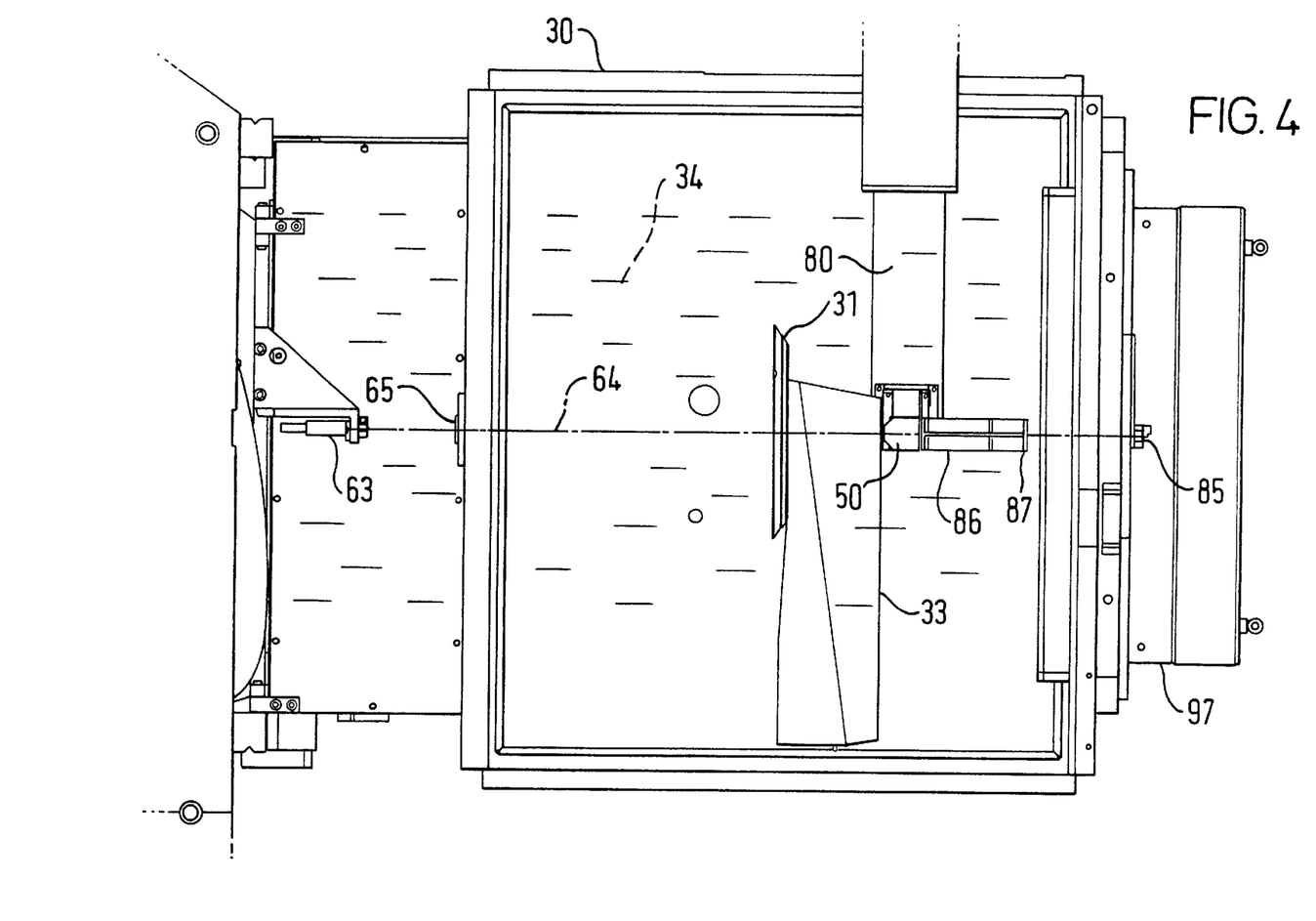
FIG. 4 is a plan view of the implant chamber of FIG. 3 with the top removed to show internal features.

Referring now to FIGS. 3 and 4, an arrangement is illustrated which permits the angle of a wafer mounted on the wafer holder in the implant chamber to be set accurately to a desired predetermined angle, so that the angle of implant can subsequently be accurately controlled.

In FIGS. 2, 3 and 4, the same reference numerals are used for corresponding parts. Thus, the wafer holder 31 in FIG. 3 is illustrated holding a wafer 32 at a position which is completely above the scanned ion beam 34 entering the implant chamber 30 through the aperture 35.

The wafer holder 31 in FIG. 3 can be moved to this position above the beam by operating the actuator 41 (FIG. 2) to drive the slide member 40 to the upper end of its stroke. Reciprocating movement of the slide member 40 translates the wafer holder 31 up and down in the direction of arrow 61 in FIG. 3. Adjustment of the rotary position of the disc 37 (FIG. 2) can adjust the angle of the linear movement of the wafer holder 31, e.g. to a new angled direction as illustrated by arrow 62. When the rotary disc 37 is set to translate the wafer holder 31 in the direction of the arrow 62, the wafer 32 on the wafer holder 31 is itself held at a corresponding angle which is no longer normal to the direction of the ion beam 34.

In FIG. 3, a laser source 63 mounted outside the implant chamber 30 directs a laser beam 64 through a window 65 into the implant chamber so as to impinge on a wafer 32 held on the wafer holder 31, when this holder is at the upper end of its reciprocating travel as illustrated. So long as the wafer holder 31 is holding the wafer 32 so that the wafer normal is precisely parallel to the datum beam direction of the implant chamber 30, the light beam from the laser is reflected back from the surface of the wafer along a line 66 through the window 65 to illuminate a sensor 67 located adjacent the laser source 63.

It will be appreciated that the wafer 32 used for this angle check should be polished so that the laser beam 64 is specularly reflected back to the sensor 67.

The sensor 67 is preferably a one dimensional position sensitive optical sensor with its axis aligned vertically, that is perpendicular to the nominal beam direction through the implant chamber and also perpendicular to the axis of rotary adjustment of the wafer holder 31. This axis is illustrated in FIGS. 2 and 3 at 56.

The laser source 63 is arranged to cast a small spot of light on the surface of the sensor 67, following reflection in the wafer 32. The signal from the sensor 67 can then be used to confirm that the spot of light on the sensor is in the position on the sensor corresponding to the normal of the wafer 32 on the wafer holder 31 being at a predetermined angle relative to the nominal beam direction in the implant chamber 30. In the present described embodiment, this predetermined angle is zero, so that the system comprising the laser 63 and sensor 67 can be used to set up the implant chamber for zero angle implants, and to reference the drive for the rotary adjustment of the wafer holder 31 to this predetermined angle.

It should be appreciated that the laser source 63 and sensor 67 can be set up so as to allow the wafer holder 31 to be referenced to a non zero implant angle. It may be assumed that the rotary disc 37 of the mechanical scanning arrangement 36 can be driven accurately to any other angle once the drive unit for the rotary disc 37 has been referenced to a known datum angle.

Referring to FIG. 1, the sensor 67 is illustrated schematically in the drawing at 70. A signal from the sensor 70 is applied along a line 71 to a controller 72. The drive unit for adjusting the rotary position of the wafer holder 20 is represented in FIG. 1 at 22 and is controlled by drive signals on a line 73 from the controller 72. Thus the controller 72 can be programmed to respond automatically to the signals on line 71 from the sensor 70 to drive the drive unit 22 to rotate the wafer holder 20 until the signal from the sensor 70 indicates that the wafer is at the predetermined datum angle. The drive unit 22 has a resolver providing position feedback to the controller 72. The controller is arranged to record the resolver reading corresponding to the zero angle implant position of the wafer as indicated by the signal on sensor 71. This zero angle resolver reading is then used as a reference position reading when the wafer holder 20 is to be rotated for implantation at non zero angles.

In other embodiments, the laser source 63 could be replaced with a different source of electromagnetic radiation. For example, a focused light source could be used which is arranged to focus light to a small spot illuminating the sensor 67 when reflected in the wafer 32.

If a one dimensional position sensor is used for the sensor 67, then the output from the sensor can be converted to a signal having a magnitude representing the position of the light spot on the sensor. Then, the controller 72 adjusts the wafer angle until the position signal from the sensor 67 has a predetermined magnitude. Position Sensitive Detectors (PSDs) suitable for use as sensor 67 are types S3979/S3931/S3932 from Hamamatsu Photonics K.K.

Instead of a position sensitive sensor, the sensor 67 may be a simple photosensor, whereupon the magnitude of the signal from the sensor 67 is at a maximum when the reflected light beam 66 is directly on the sensor.

The laser source 63 may be arranged to modulate the light beam 64 at a selected frequency, whereupon the controller 72 is responsive to the amplitude of the corresponding frequency variation of the signals from the sensor 67. This arrangement reduces the effect of ambient light.

Referring again to FIGS. 3 and 4, the travelling Faraday 50 is shown mounted on a telescopic arm 80 to allow the Faraday to be moved to various positions in the direction of scanning of scanned beam 34.

When the wafer holder 31 is moved by the linear drive 41 to a position, such as illustrated in dotted outline at 81 in FIG. 3, in which the wafer 32 does not intercept the laser beam 64, the laser beam then continues along a line of transmission 82, to exit the implant chamber 30 through a further window 83 in the rear wall 84 of the chamber. An additional photosensor 85 is mounted outside the chamber so as to be illuminated by the laser beam passing through the window 83.

As shown in FIG. 4, the laser beam 64 is directed along the centre line of the implant chamber and in a direction which is parallel to the datum beam direction of the chamber.

The Faraday 50 has an arm 86 extending rearwardly from the Faraday and carrying on its rear end a flag 87. When the Faraday 50 is located by means of the telescopic arm 80 so as to be precisely on the centre line of the implant chamber, the flag 87 intercepts the laser beam travelling along the line of transmission 82 to the sensor 85. The flag 87 preferably includes a narrow slit or small hole which has a dimension similar to the diameter of the focused spot of the laser beam impinging on the flag 87. Thus, when the Faraday 50 is close to the centre line, the spot of the laser beam illuminates the hole or slit, allowing laser light to pass through the slit or hole to illuminate the sensor 85. Correct alignment of the Faraday 50 is determined when the signal from the photosensor is a maximum.

Referring again to FIG. 1, the sensor 85 is represented schematically behind the beam stop 23. The signal from the sensor 85 is supplied along a line 88 to the controller 72. The controller 72 controls the adjustment of the position of the travelling Faraday 24 by control signals along a line 89 to an actuator 90 for the telescopic arm 80 of the travelling Faraday.

The actuator 88 also provides to the controller 72 a position feedback signal and this feedback signal is recorded by the controller 72 for use thereafter as a reference position for the travelling Faraday. In this way, subsequent positioning of the travelling Faraday can be made accurately. As explained previously, the travelling Faraday may be used, in association in this example with timing pulses from the beam stop, for setting up the alignment of the ion beam and checking and confirming beam parallelism.

In the above described example, the same laser source 63 is used for checking the wafer angle on the wafer holder 31 and also for checking the datum position of the travelling Faraday 50. In other arrangements a separate light source may be used for the travelling Faraday check. Further, the light source for the travelling Faraday need not be a focused light source but could take the form of a point light source which would case an accurate shadow of the flag 87 on the sensor 85.

Although the arrangement illustrated in FIGS. 3 and 4 allow the datum position of the travelling Faraday to be set at the centre line of the implant chamber, another datum position could be selected, so long as this is accurately known within the implant chamber.

In a further embodiment of the invention, the flag 87 is mounted directly on the Faraday 50 so as to be in the same plane as the entrance slit of the Faraday. This avoids any possibility of error arising due to misalignment of the flag 87 with the Faraday 50, e.g. if the slot in the flag 87 and the entrance slit of the Faraday 50 are not precisely aligned parallel to the datum centre line of the implant chamber.

In a yet further embodiment, the sensor 85 is located on the opposite side of the plane of the scanned beam 34 compared to the light source 63, so that the light beam traverses obliquely from top to bottom across the page in FIG. 3. Then, the beam 64 from the laser source 63 may be used for setting up a datum wafer angle for the wafer holder 31 which is other than perpendicular to the ion beam direction. For example, the datum angle for the wafer normal may be set up at 20° to the beam direction. This datum angle can still be used as a reference by the controller 72 to establish the required implant angle of the wafer holder 31, including a zero implant angle.

In FIGS. 3 and 4 the laser beam 64 is reflected substantially at the centre of the wafer 32 on the wafer holder 31. The reflection point on the wafer 32 can be scanned across the wafer by translating the wafer holder 31 in the direction of the arrow 61. Also, provision may be made to enable the wafer holder 31 itself to be rotatable on the scan arm 33 about the normal axis of the wafer 32, i.e. rotatable in the direction of arrow 90 illustrated in FIG. 2. By changing the rotary position of the wafer holder 31 on the scan arm and also changing the translation position of the scan arm, the angle of all points on the wafer 32 can be checked. Thus, the system may be used for checking any deviation out of flat of the wafer holder 31, which records a corresponding deviation in the flatness of the reflecting surface of the wafer 32.

Figure 5:
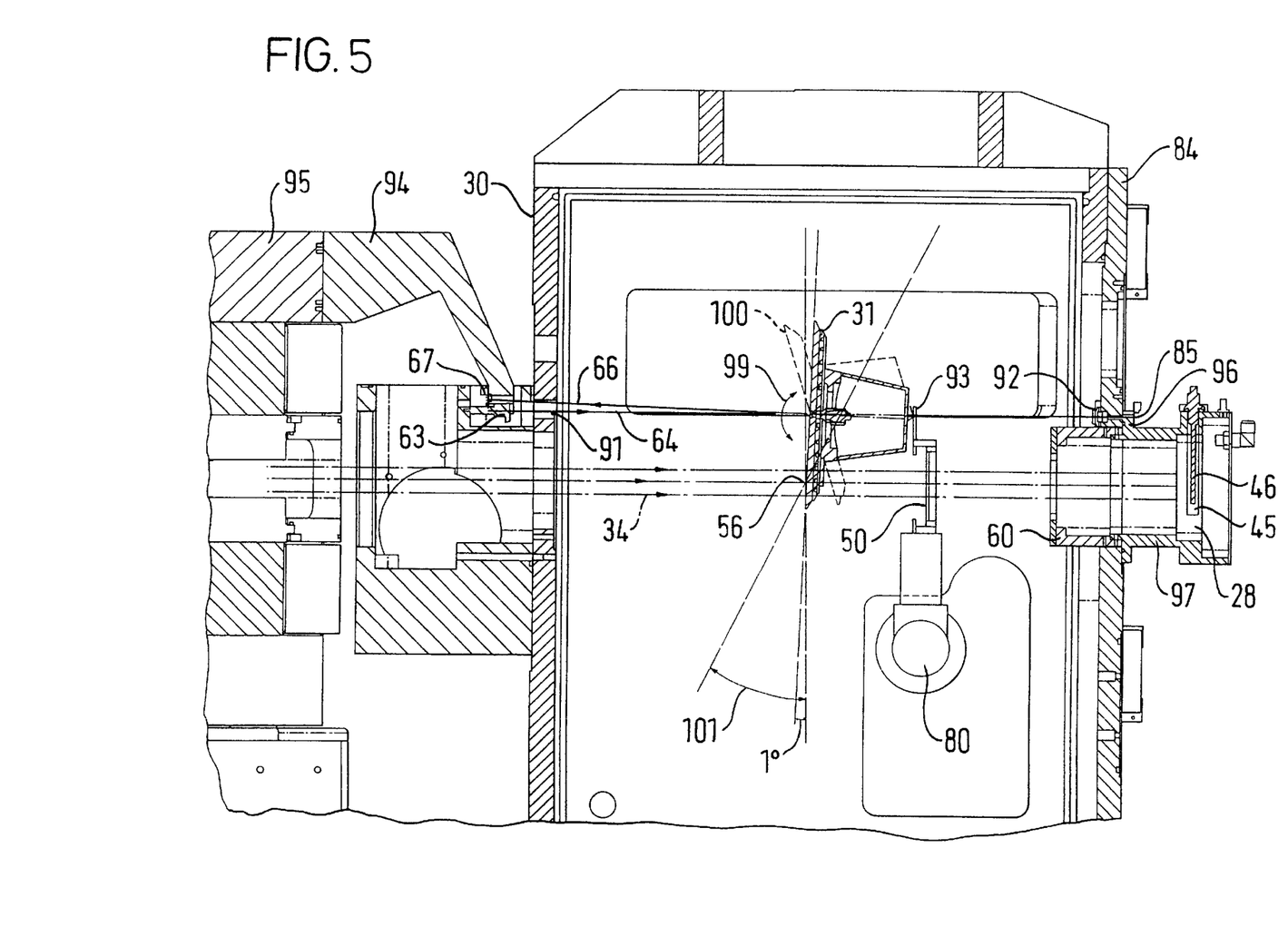
FIG. 5 is a cross-sectional view in elevation of a further embodiment of the invention.

A further embodiment of the invention will now be described in greater detail with reference to FIGS. 5 and 6. In FIG. 5, components which are essentially the same as those illustrated in FIG. 3 are identified by the same reference numeral.

Referring to FIG. 5, the laser source 63 is mounted outside the process chamber 30 at a position which is closer to the line of the scanned ion beam 34, compared with the arrangement of FIG. 3. Nevertheless, as in FIG. 3, a beam 64 from the laser source 63 is directed so as to be reflected back by a clean unprocessed wafer on the wafer holder 31. When the wafer holder 31 is at a predetermined angle, the reflected beam 66 illuminates sensor 67. The correct angle of the wafer on the wafer holder 31 is determined by monitoring the sensor 67 which is a one dimensional position sensitive detector oriented vertically in FIG. 5, that is perpendicular to the axis of rotary adjustment of the wafer holder 31. A window 91 is provided in the front wall of the process chamber 30 to allow the laser beam 64 and the reflected beam 66 to pass into and out of the chamber.

In the example of FIG. 5, the laser beam 64 from the source 63 is directed substantially horizontally, parallel to the plane of the ion beam 34. As a result, the predetermined angle of the wafer holder 31 which causes the reflected beam 66 to illuminate the sensor 67 at the datum position is no longer perpendicular to the ion beam, but at a small angle, approximately 1°, to the perpendicular (zero implant angle) position. As mentioned previously, so long as this set up angle is precisely known, the controller can reference the encoder reading for the rotary adjustment of the holder to this value, in response to the signal from the sensor 67, and thereby accurately control the angular position of the wafer holder 31 at any other desired angle.

When the wafer holder 31 is translated so as to be clear of the laser beam 64, this beam illuminates an in-line sensor 85 mounted outside the rear wall 84 of the implant chamber 30. A small window 92 is provided to allow the laser beam to pass through the rear wall 84 to illuminate the sensor 85.

As with the arrangement of FIGS. 3 and 4, in this configuration, the laser beam 64 is used for setting up the datum position of the travelling Faraday 50. As shown in FIG. 5, the travelling Faraday 50 is fitted with a flag 93 which obstructs the laser beam 64 except when the travelling Faraday is at the datum position. The flag 93 is, in this embodiment, aligned substantially parallel with the entrance slit of the travelling Faraday to minimise errors which could be caused by misalignment of the flag relative to the entrance slit.

Importantly in the example illustrated in FIG. 5, the laser source 63 and reflection sensor 67 are both mounted by a bracket 94 which is itself directly secured to the housing 95 of the collimator part of the scanner and collimator combination (illustrated schematically at 14 and 16 in FIG. 1). Also, the in-line sensor 85 is itself solidly mounted on a flange 96 of the casing 97 of the beam stop 60.

It will be understood by those skilled in the art of electrostatic or magnetic scanning and collimating of ion beams, that the scanner and collimator combination is designed to define an ideal centre line and beam direction for the parallel scanned beam emerging from the collimator part 95. In practice, the scanner and collimator combination works to its specification only if the various controllable parameters of the scanner and collimator are adjusted to ensure that the scanned beam emerging from the collimator is in fact centred and aligned with the ideal centre line around which the scanner and collimator combination has been designed.

Therefore, by mounting the laser source 63 and the reflection sensor 67 directly from the housing 95 of the collimator, the laser source and reflection sensor can be accurately referenced geometrically to the collimator, and hence to the ideal beam centre line and direction defined by the collimator. In this way, when the laser source 63 and reflection sensor 67 are used to set up the wafer angle in the implant chamber 84, this angle also will be referenced correctly to the ideal beam centre line.

It should be noted that the wafer holder 31 is provided with rotary adjustment only around axes which are essentially perpendicular to the direction of the ion beam and parallel to plane of the scanned beam. For good implant performance, it is also desirable to ensure that the holder 31 maintains the wafer at a precisely predictable angle to the ideal centre line of the beam about an axis perpendicular to the plane of the beam. To achieve this, the laser source 63 and reflection sensor 67 are first accurately positioned relative to the housing 95 of the collimator. Then, when the implant chamber 30 is assembled and married to the collimator, during construction of the implanter, the entire chamber 30 may be adjusted for rotation about an axis substantially perpendicular to the beam scanning plane, until the reflected beam 66 from a clean wafer mounted on the holder 31 is accurately reflected back to the sensor 67. During this procedure it will be necessary, of course, to ensure that the rotary position of the wafer holder 31 about an adjustment axis parallel to the plane of scanning is maintained so as to keep the reflected beam 66 on the sensor 67 in the vertical direction, i.e. in the plane of the paper in FIG. 5. However, in order to ensure that the reflected beam 66 strikes the sensor 67 in a horizontal plane, perpendicular to the plane of the paper, the entire implant chamber 30 is adjusted in position. This adjustment can be achieved by inserting shims and the like during the assembly process. The adjustment is necessary to ensure accurate orientation of the wafer holder 31 about a vertical axis, since accumulated tolerances in the construction of the various parts between the exit face of the collimator housing 95 and the wafer supporting surface of the wafer holder 31 could otherwise result in a wafer on the wafer holder being slightly at an acute angle to the ion beam in the plane of scanning of the beam.

When the implant chamber 30 has been adjusted in position (about an axis perpendicular to the scanning plane) as described above, the ideal centre line of the ion beam may no longer be coincident with the nominal centre line of the implant chamber itself. This may best be understood by reference to FIG. 4 which is a plan view of the implant chamber. The laser beam 64 should continue to be aligned with the ideal centre line of the ion beam, since the laser source 63 is referenced, as explained above, to the collimator housing. However, once the implant chamber 30 has been adjusted (about an axis perpendicular to the paper in FIG. 4) to ensure that the laser beam 64 is precisely perpendicular to a wafer on the wafer holder 31 in a plane parallel to the scanning plane, the laser beam 64 may no longer be precisely coincident with the centre of the beam stop 60.

As described above, the beam stop 60 includes at least one fixed beam detector comprising the collecting rod 46 mounted behind a slit in the beam stop plate 28. In constructing the beam stop 60, the slit in the beam stop plate is located in the centre of the beam stop, so as to be on the nominal centre line of the implant chamber. In this way, the timing pulse obtained from the beam detector in the beam stop should indicate the time the scanned beam passes the centre of the beam stop. If the implant chamber 30 is adjusted in position as described above so as to orientate the wafer holder 31 correctly, the centre of the beam stop, and thus the location of the central timing slit, may no longer be precisely on the ideal centre line of the scanned beam. As has been explained previously, and is also explained in our co-pending application mentioned above, this error need not be a problem so long as the distance of the central timing slit of the beam stop from the ideal centre line of the scanned beam is known.

The in-line sensor 85 is, as mentioned above, mounted so as to be referenced in position to the beam stop itself. Thus, any misalignment between the ideal centre line of the scanned beam, and the nominal centre of the implant chamber and beam stop, results in the spot from the laser beam 64 striking the sensor 85 at an off centre position. The sensor 85 is a one dimensional position sensitive detector with its axis arranged substantially horizontally, i.e. parallel to the scanning plane. In this way, the deviation of the ion beam 64, and hence of the ideal centre line of the scanned beam, from the nominal centre of the beam stop can be measured directly from the output of the sensor 85 and this figure can be used for correcting the timing signal or signals derived from the slit or slits in the beam stop.

In a preferred embodiment, the in-line sensor 85 may be mounted on the beam stop 60 so as to be adjustable in the vertical direction (in the plane of the paper of FIG. 5). Then, when the implant chamber is first being set up, the position of the sensor 85 in this vertical direction can be adjusted so as to ensure the laser beam 64 strikes the position sensor so that the horizontal deviation of the ideal centre line of the beam from the nominal centre of the beam stop can be measured. Importantly, any such adjustability in the vertical direction of the sensor 85 should not result in any change in the horizontal position which is referenced to the beam stop.

It may be noted that the in-line sensor 85 can provide a signal to indicate a central datum position of the travelling Faraday 50, which will still be correctly referenced to the ideal centre line of the scanned beam. If the flag 93 on the travelling Faraday 50 has a vertically orientated slit which is substantially the same size or slightly smaller than the diameter of the laser beam, then the correct datum position of the travelling Faraday is indicated when the signal from the sensor 85 represents a maximum amplitude of laser illumination on the sensor.

In the description so far, the wafer holder 31 has been described to be adjustable in rotary position only about an axis 56, being the axis of adjustment of the linear translation mechanism of the wafer holder for adjusting not only the wafer angle but also the translation angle through the plane of the scanned beam. Generally, it is highly desirable to ensure that the wafer is indeed translated through the plane of the scanned beam always in a translation plane parallel to the plane of the wafer. However, it can also be useful to enable the support arm 33 (FIG. 2) carrying the wafer holder 31 to be rotatable relative to the translation mechanism, substantially about its own axis. This degree of freedom is represented by the arrow 98 in FIG. 2 and may be provided by mounting the support arm 33 in a rotary vacuum bearing in the slide plate 40 and providing a suitable electric motor drive mechanism (not shown in FIG. 2 for clarity). This rotary adjustability of the wafer holder 31 about an axis essentially through the centre of the wafer is illustrated in FIG. 5 by the arrow 99 and the dotted image of the wafer holder 100. By comparison, the rotary adjustability of the translation mechanism is represented in FIG. 5 by the arrow 101. The ability to rotate the wafer holder 31 about its own axis enables the wafer holder 31 to be brought horizontal, e.g. for loading and unloading, whilst at an upper extreme, for example, of its mechanical translation.

As mentioned before, it is considered desirable in hybrid scanning implanters of this kind, to ensure that the translation scanning of the wafer holder through the plane of the scanned ion beam keeps the plane of the wafer accurately parallel to the translation direction for all implant angles. The arrangement described above for setting up the reference angle of the wafer relative to the ideal beam centre line and beam direction can also be used for ensuring that the rotary drive enabling rotation of the wafer holder about its own axis (represented by arrow 99) is adjusted so that the wafer is parallel to the direction of translation.

Figure 6:
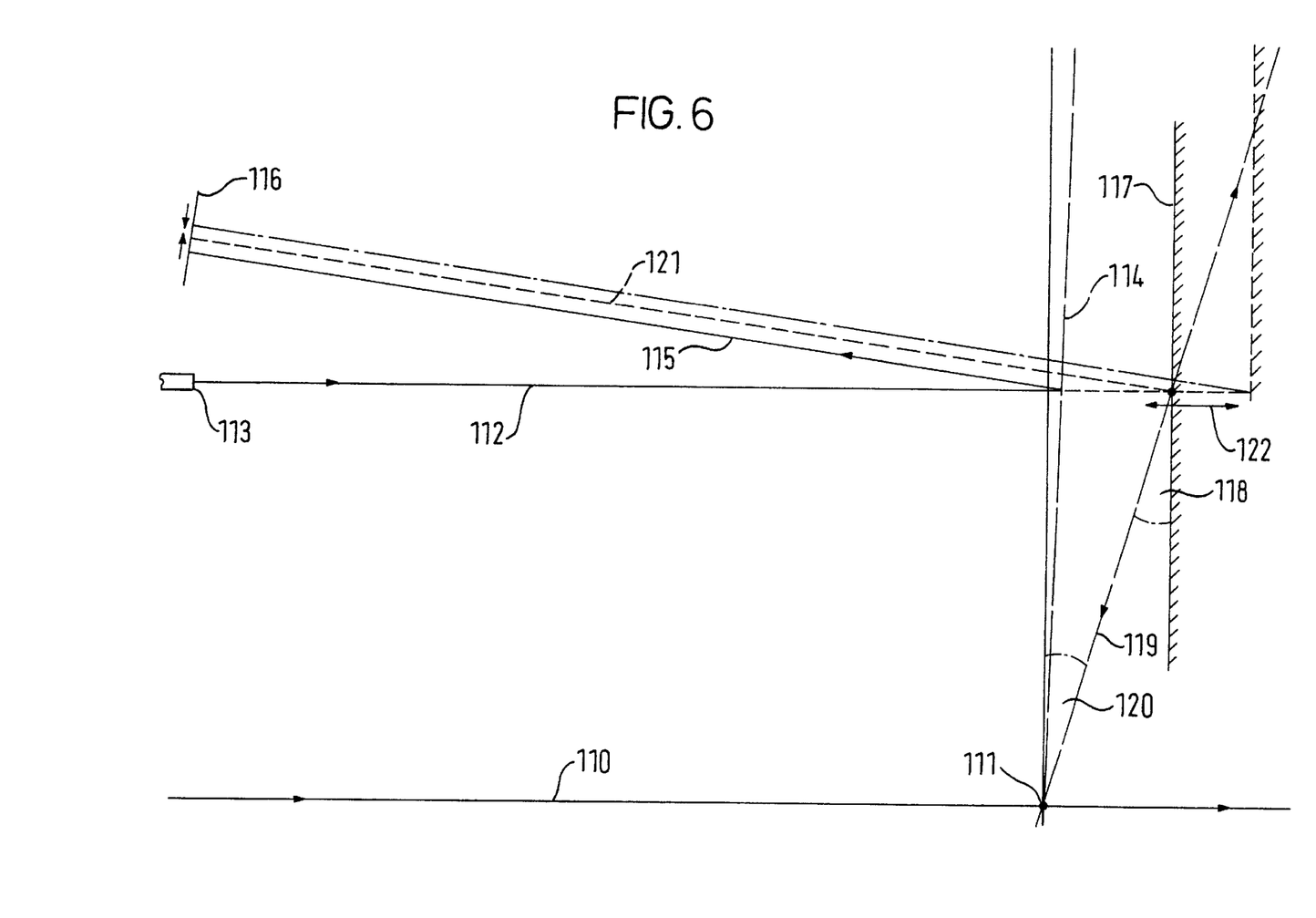
FIG. 6 is a schematic illustration of an embodiment of the invention.

Referring to FIG. 6, the ideal beam centre line is illustrated schematically at 110. The axis of rotation of the translation mechanism in the implant chamber is illustrated at 111. For a perfect set up of the implant holder, the beam 112 from the laser source 113 is accurately reflected from a wafer 114 on the wafer holder so that the reflected beam 115 impinges on the centre of the position sensitive detector 116. As can be seen, the wafer 114 is in a plane which passes through the axis 111 of adjustability of the translation mechanism, so that the wafer plane is parallel to the direction of translation.

By comparison, if a wafer 117 is at an angle 118 to the direction 119 of translation, initial setting up by adjusting only the translation angle 120 would result in a reflected beam 121 back to the centre point of the detector 116. It can be seen that the orientation of the wafer 117 must be slightly different compared to the orientation indicated by the line 114, in order to return the reflected laser beam to the centre of the sensor 116. However, if the wafer holder 31 is then translated by the translation mechanism along the line 119, so that the point of reflection of the laser beam 112 moves up and down the surface of the wafer, it can be seen that this point of reflection also moves to and fro along the line of transmission of the laser beam, as indicated by the arrow 122. This movement can be detected on the position sensitive detector 116 by a corresponding movement of the reflected spot along the sensitive length of the detector.

Accordingly, the arrangement disclosed in FIG. 5 may also be used for ensuring that the drive unit for the wafer arm, providing rotation in the direction of arrow 99, is set to the position at which the wafer is accurately parallel to the translation direction. In operation, the controller illustrated in FIG. 1 may additionally provide control of the drive unit adjusting the rotary position of the wafer support arm about its own axis. Then, during a setting up cycle, both the drive unit for the support arm and the drive unit controlling the rotary position of the translation mechanism are together controlled until the reflected spot is stationary on the middle of the position sensitive detector 116, as the translation mechanism drives the wafer to and fro in the translation direction.

It may be noted that in other embodiments of the invention, the beam stop 23 is not a Faraday for measuring total beam current. Instead the beam stop may simply absorb the energy of the ion beam by-passing the wafer. Further, the travelling Faraday 24 may be any other form of travelling beam detector and need not be designed for accurate dosimetry measuring.

In the above described arrangements for confirming the wafer angle, the laser beam is described as reflected at a surface of a wafer held on the wafer holder. The holder angle, and therefore the wafer angle, can also be confirmed by reflecting the beam at a surface of the holder itself which is known to be parallel to a surface of a wafer when held on the holder. For example the wafer support surface of the holder may be used. In another arrangement, a surface of the holder may be used which is at a known angle to a wafer when held on the holder.

What is claimed is:

1. An ion implanter having an evacuatable implant chamber,
   a holder inside the chamber for holding a semiconductor wafer at a selected wafer angle during implantation, said holder being adjustable about at least one axis parallel to the plane of a wafer on the holder for changing said wafer angle,
   a source of focused electromagnetic radiation, mounted relative to said implant chamber and arranged to direct said radiation for reflection at a surface of a wafer held on said holder or at a surface of the holder, which is parallel or at a known angle to the plane of a wafer when held on said holder,
   a sensor mounted relative to said implant chamber to receive radiation from said source reflected specularly by the wafer surface or by said holder surface, said sensor providing a signal, in response to the reflected radiation, which is indicative of a predetermined wafer angle, a drive unit to adjust the rotary position of said holder about said axis and providing a rotary position signal, and a controller responsive to said signal from said sensor to reference the rotary position of said holder represented by said rotary position signal to said predetermined wafer angle indicated by said sensor signal.

2. An ion implanter as claimed in claim 1, wherein said source of electromagnetic radiation and said sensor are mounted outside said chamber, and said chamber has at least one window transparent to said radiation through which the focused radiation from said radiation source is directed into the chamber, and the reflected radiation leaves the chamber for reception by said sensor.

3. An ion implanter as claimed in claim 1, wherein said radiation source and said sensor are mounted adjacent to one another on opposite sides of a plane parallel to said axis of adjustability of the wafer holder.

4. An ion implanter as claimed in claim 1 wherein said radiation source is arranged to produce an illuminated spot of said reflected radiation on said sensor.

5. An ion implanter as claimed in claim 4, wherein said radiation source is a laser arranged to provide a substantially parallel beam of said radiation.

6. An ion implanter as claimed in claim 4, wherein said sensor has a sensitive area providing a signal representative of the position of said illuminated spot on said area at least in a direction perpendicular to said axis of adjustability of the holder.

7. An ion implanter as claimed in claim 6, wherein said controller is responsive to the signal from said sensor to control said drive unit to adjust said holder position to bring said illuminated spot to a desired position on the sensitive area of the sensor corresponding to the predetermined wafer angle.

8. An ion implanter as claimed in claim 1, having a source of ions to be implanted, and a scanner and collimator combination to produce a parallel scanned beam of said ions in said implant chamber for implantation in a wafer on said holder.

9. An ion implanter as claimed in claim 8, wherein said scanner and collimator combination define an ideal beam direction for said parallel scanned beam, and said radiation source and said sensor are mounted so as to be referenced to said ideal beam direction defined by the scanner and collimator combination, whereby said predetermined wafer angle is referenced to said ideal beam direction.

10. An ion implanter as claimed in claim 6, further including a source of ions to be implanted, and a scanner and collimator combination to produce a parallel scanned beam of said ions in said implant chamber for implantation in a wafer on said holder, wherein said scanner and collimator combination scans the beam in a scan direction perpendicular to the beam direction in a beam scanning plane, and the implanter further includes an actuator for translating the wafer holder through the beam scanning plane in a translation plane containing said scan direction and having a translation angle to the normal to the beam scanning plane, a first rotary drive unit to adjust said translation angle and effecting a corresponding adjustment of said wafer angle, a second rotary drive unit to change the angle of the wafer holder relative to the actuator about an axis parallel to said scan direction to adjust the angle of a wafer on the holder relative to said translation angle, and a controller responsive to the signal from the said sensor to control said first rotary drive unit to adjust said translation angle and said wafer angle to bring said illuminated spot to a desired position on the sensitive area of the sensor corresponding to the predetermined wafer angle, and to control said second rotary drive to adjust the wafer angle relative to the translation angle to minimise any movement of said spot on said sensor when said actuator translates the wafer to move the point of reflection of said radiation over the surface of the wafer.

11. An ion implanter as claimed in claim 8, further comprising:
   a travelling beam detector movable in said implant chamber along a line parallel to the direction of scanning of said beam and useable for checking alignment of the scanned beam;
   a point source of electromagnetic radiation mounted relative to said implant chamber; and
   an in-line sensor mounted at a predetermined position relative to said implant chamber so as to be responsive to the radiation from said source received along a line of transmission crossing said line of movement of the travelling beam detector, the travelling beam detector having a structure which interrupts at least partially said radiation received by the in-line sensor, whereby said in-line sensor provides a signal indicative of at least one predetermined position of the travelling beam detector.

12. An ion implanter as claimed in claim 11, wherein said point source is constituted by said source of focused radiation, and the implanter further includes an actuator for translating the wafer holder transversely of the plane of the scanned beam.

13. An ion implanter having an evacuatable implant chamber,
a source of ions to be implanted,
a scanner and collimator combination to produce a parallel a scanner and collimator combination to produce a parallel scanned beam of said ions in said implant chamber for implantation in a semiconductor wafer,
a travelling beam detector movable in said implant chamber along a line parallel to the direction of scanning of said beam and useable for checking alignment of the scanned beam,
a point source of electromagnetic radiation mounted relative to said implant chamber, and
an in-line sensor mounted at a predetermined position relative to said implant chamber so as to be responsive to the radiation from said source received along a line of transmission crossing said line of movement of the travelling beam detector, the travelling beam detector having a structure which interrupts at least partially said radiation received by the in-line sensor, whereby said in-line sensor provides a signal indicative of at least one predetermined position of the travelling beam detector.

14. An ion implanter as claimed in claim 13, wherein said scanner and collimator combination define an ideal centre line for said parallel scanned ion beam in the implant chamber and said radiation point source directs a beam of said radiation along said line of transmission and is mounted so as to be referenced to said ideal beam centre line so that said line of transmission and therefore said predetermined position of the travelling beam detector are referenced to said ideal beam centre line.

15. An ion implanter as claimed in claim 14, further including a beam stop to receive the scanned beam, said beam stop including at least one fixed beam detector providing a timing signal indicating the timing of the ion beam scanning over the fixed beam detector at the beam stop, wherein said point source of radiation provides an illuminated spot of radiation on said in-line sensor and said in-line sensor is mounted so as to be referenced to said beam stop and to the position of said fixed beam detector, said in-line sensor having a sensitive area providing a signal representing the position of said illuminated spot on said area at least in a direction parallel to said beam scanning direction, whereby the position of said fixed beam detector relative to the line of transmission can be determined.

16. An ion implanter as claimed in claim 15, wherein said in-line sensor is mounted to be adjustable in position relative to the beam stop in a direction which is orthogonal to said direction for which said sensor provides a position signal, and is transverse to said line of transmission.

17. An ion implanter as claimed in claim 13, wherein said line of transmission is substantially perpendicular to said line of movement of the travelling beam detector.

18. An ion implanter as claimed in claim 14, wherein said line of transmission is in a plane containing said ideal centre line and perpendicular to said line of movement.

19. An ion implanter as claimed in claim 13, wherein said structure of the travelling beam stop is a flag.

20. An ion implanter as claimed in claim 19, wherein the flag has a slot extending perpendicular to said line of movement to permit said radiation to illuminate the sensor when the travelling beam stop is at said predetermined position.

21. An ion implanter as claimed in claim 19, wherein said travelling beam sensor has a slit opening aligned perpendicular to said beam scanning direction for receiving beam ions as the beam is scanned over the detector, and said flag is in a plane perpendicular to the beam direction which contains said slit opening.

22. An ion implanter as claimed in claim 13, wherein said source is mounted outside the implant chamber and the chamber has a window transparent to said radiation through which radiation from the source can enter the chamber along said line of transmission.

23. An ion implanter as claimed in claim 13, wherein said in-line sensor is mounted outside the implant chamber and the chamber has a window through which said radiation can leave the chamber along said line of transmission.

24. An ion implanter having an evacuatable implant chamber, a source of ions to be implanted, a scanner and collimator combination to produce a parallel scanned beam of said ions in said implant chamber for implantation in a semiconductor wafer, said scanner and collimator combination defining an ideal centre line for said parallel scanned ion beam in the implant chamber, a source of electromagnetic radiation which directs a beam of said radiation along a line of transmission, and which is mounted so as to be referenced to said ideal beam centre line so that said line of transmission is referenced to said ideal beam centre line, a beam stop to receive the scanned beam, said beam stop including at least one fixed beam detector providing a timing signal indicating the timing of the ion beam scanning over the fixed beam detector at the beam stop, and an in-line sensor mounted on said line of transmission and so as to be referenced to said beam stop and to the position of said fixed beam detector, said radiation beam source providing an illuminated spot of radiation on aid in-line sensor, said in-line sensor having a sensitive area providing a signal representing the position of said illuminated spot on said area at least in a direction parallel to said beam scanning direction, whereby the position of said fixed beam detector can be determined relative to said line of transmission and thereby relative to said ideal centre line.

25. A method of referencing the position of a travelling beam detector to the ion beam in a scanned beam type ion implanter, comprising the steps of:
determining a datum beam centre line referenced to the beam line of the ion implanter,
directing a beam of radiation, referenced to said datum beam centre line, across the path of travel of the travelling beam detector, and
detecting the interception of the beam of radiation by the travelling beam detector, as it travels along its path of travel, to identify a position of the travelling beam detector relative to said beam.

26. A method of aligning a wafer holder to the ion beam in an ion implanter, comprising the steps of:
determining a datum beam direction referenced to the beam line of the ion implanter,
directing a beam of radiation towards the wafer holder along a direction which is referenced to said datum beam direction, and
monitoring radiation reflected in a surface of a wafer held on the holder or in a surface of the holder which is parallel or at a known angle to a surface of a wafer when held on the holder to determine the alignment of the wafer holder relative to the radiation beam.

27. A method of referencing the position of a fixed beam detector to the ion beam in a scanned beam type ion implanter, comprising the steps of:

determining a datum beam centre line referenced to the beam line of the ion implanter, directing a beam of radiation, referenced to said datum beam centre line, towards said fixed beam detector, and monitoring the position of said beam of radiation at said fixed beam detector to determine the position of said fixed beam detector relative to said datum beam centre line.

* * * * *